US008414145B2

(12) United States Patent  (10) Patent No.: US 8,414,145 B2
Mitsuishi et al.  (45) Date of Patent: Apr. 9, 2013

(54) LIGHT EMITTING DEVICE

(75) Inventors: Iwao Mitsuishi, Tokyo (JP); Yumi Fukuda, Tokyo (JP); Aoi Okada, Tokyo (JP); Naotoshi Matsuda, Kanagawa (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 239 days.

(21) Appl. No.: 13/033,960

(22) Filed: Feb. 24, 2011

(65) Prior Publication Data

US 2012/0057339 A1  Mar. 8, 2012

(30) Foreign Application Priority Data

Sep. 6, 2010 (JP) .................................. 2010-198631

(51) Int. Cl.
*F21V 9/00* (2006.01)
(52) U.S. Cl.
USPC .......................................... 362/231; 313/502
(58) Field of Classification Search .......... 313/484–487, 313/489, 498, 468, 500–503, 499; 257/98–100, 257/79–80; 362/235, 227, 231, 291, 293, 362/545, 800; 345/44, 46; 252/301.4 R, 252/301.4 F, 301.6 R
See application file for complete search history.

(56) References Cited

U.S. PATENT DOCUMENTS

| 7,884,538 | B2 | 2/2011 | Mitsuishi et al. |
| 2009/0096361 | A1 | 4/2009 | Fukuda et al. |
| 2010/0025632 | A1 | 2/2010 | Fukuda et al. |
| 2010/0102707 | A1 | 4/2010 | Fukuda et al. |

FOREIGN PATENT DOCUMENTS

JP  2009-212275  9/2009

OTHER PUBLICATIONS

U.S. Appl. No. 13/214,410, filed Aug. 22, 2011, Mitsuishi, et al.
U.S. Appl. No. 13/214,444, filed Aug. 22, 2011, Mitsuishi, et al.
U.S. Appl. No. 13/214,572, filed Aug. 22, 2011, Mitsuishi, et al.
U.S. Appl. No. 13/214,377, filed Aug. 22, 2011, Mitsuishi, et al.
U.S. Appl. No. 13/214,608, filed Aug. 22, 2011, Mitsuishi, et al.
U.S. Appl. No. 13/221,042, filed Aug. 30, 2011, Okada, et al.
U.S. Appl. No. 13/039,082, filed Mar. 2, 2011, Kato, et al.
U.S. Appl. No. 13/033,954, filed Feb. 24, 2011, Mitsuishi, et al.
U.S. Appl. No. 13/034,137, filed Feb. 24, 2011, Mitsuishi, et al.
U.S. Appl. No. 13/034,120, filed Feb. 24, 2011, Mitsuishi, et al.
U.S. Appl. No. 13/037,635, filed Mar. 1, 2011, Okada, et al.
U.S. Appl. No. 12/875,507, filed Sep. 3, 2010, Okada, et al.
U.S. Appl. No. 12/869,279, filed Aug. 26, 2010, Fukuda, et al.

*Primary Examiner* — Karabi Guharay
*Assistant Examiner* — Elmito Breval
(74) *Attorney, Agent, or Firm* — Oblon, Spivak, McClelland, Maier & Neustadt, L.L.P.

(57) ABSTRACT

A light emitting device according to one embodiment includes: a board; plural first light emitting units each including a first light emitting element and a first fluorescent layer formed on the first light emitting element having a green phosphor; plural second light emitting units each including a second light emitting element and a second fluorescent layer formed on the second light emitting element having a red phosphor; the second fluorescent layers and the first fluorescent layers being separated in a non-contact manner with gas interposed there between; and plural third light emitting units each including a third light emitting element and a resin layer formed on the third light emitting element having neither a green phosphor nor the red phosphor, the third light emitting units being disposed between the first light emitting units and the second light emitting units.

12 Claims, 4 Drawing Sheets

LIGHT EMITTING DEVICE

CROSS-REFERENCE TO RELATED APPLICATION

This application is based upon and claims the benefit of priority from Japanese Patent Application No. 2010-198631, filed on Sep. 6, 2010; the entire contents of which are incorporated herein by reference.

FIELD

Embodiments described herein relate generally to a light emitting device.

BACKGROUND

Recently, attention focuses on a so-called white-color Light Emitting Device (LED) in which a yellow phosphor such as YAG:Ce is combined with a blue LED to emit white-color light by single chip. Conventionally, the LED emits red, green, or blue light in monochromatic form, and it is necessary that plural LEDs emitting monochrome wavelengths are driven in order to emit the white-color light or intermediate-color light. However, currently the combination of the light emitting diode and the phosphor realizes the white-color light with a simple structure.

An LED lamp in which the light emitting diode is used is applied to various display devices of a mobile device, a PC peripheral device, an OA device, various switches, a light source for backlight, and a display board. In the LED lamps, there is a strong demand for high efficiency. Additionally, there is a demand for high color rendering in general-purpose lighting applications, and there is a demand for high color gamut in LCD TV backlight applications. High efficiency of the phosphor is required for the purpose of the high efficiency of the LED lamp, and a white-color light source in which a light source emitting blue excitation light, a phosphor excited by blue light to emit green light, and a phosphor excited by blue light to emit red light are combined is preferable for the high color rendering and the high color gamut.

The high-power LED generates heat during its operation, and generally the phosphor is heated up to about 100 to about 200° C. When the temperature rise is occurred, generally emission intensity of the phosphor is degraded to cause so-called thermal quenching. Therefore, the luminous efficiency is degraded particularly in a high-temperature range, that is, a high-current range.

Additionally, when plural phosphors are used, the luminous efficiency is degraded by reabsorption between phosphors. Particularly, when the white-color light is obtained by a combination of the plural phosphors on one LED chip, the problem becomes obvious by shortening a distance between the phosphors.

DETAILED DESCRIPTION

A light emitting device according to one embodiment includes: a board; a plurality of first light emitting units each of which includes a first light emitting element that is mounted on the board to emit light having a wavelength of 250 nm to 500 nm and a first fluorescent layer that is formed on the first light emitting element, the first fluorescent layer including a green phosphor; a plurality of second light emitting units each of which includes a second light emitting element that is mounted on the board to emit the light having the wavelength of 250 nm to 500 nm and a second fluorescent layer that is formed on the second light emitting element, the second fluorescent layer including a red phosphor, the second fluorescent layers and the first fluorescent layers being separated in a non-contact manner with gas interposed therebetween; and a plurality of third light emitting units each of which includes a third light emitting element that is mounted on the board to emit the light having the wavelength of 250 nm to 500 nm and a resin layer that is formed on the third light emitting element, the resin layer including neither a green phosphor nor the red phosphor, the third light emitting units being disposed between the first light emitting units and the second lights emitting unit.

Embodiments will be described below with reference to the drawings.

As used herein, the green phosphor means a phosphor that emits light ranging from a blue-green color to a yellow-green color (hereinafter also referred to as green color), that is, light having a peak at the wavelength of 490 to 580 nm, which is longer than the excitation light, when the phosphor is excited by light having the wavelength of 250 nm to 500 nm, that is, near-ultraviolet light or blue light.

As used herein, the red phosphor means a phosphor that emits light ranging from an orange color to a red color (hereinafter also referred to as red color), that is, light having a peak at the wavelength of 580 to 700 nm, which is longer than the excitation light, when the phosphor is excited by the light having the wavelength of 250 nm to 500 nm, that is, the near-ultraviolet light or the blue light.

As used herein, the yellow phosphor means a phosphor that emits yellow light, that is, light having a peak at the wavelength of 550 to 580 nm, which is longer than the excitation light, when the phosphor is excited by the light having the wavelength of 250 nm to 500 nm, that is, the near-ultraviolet light or the blue light.

First Embodiment

Figure 1:
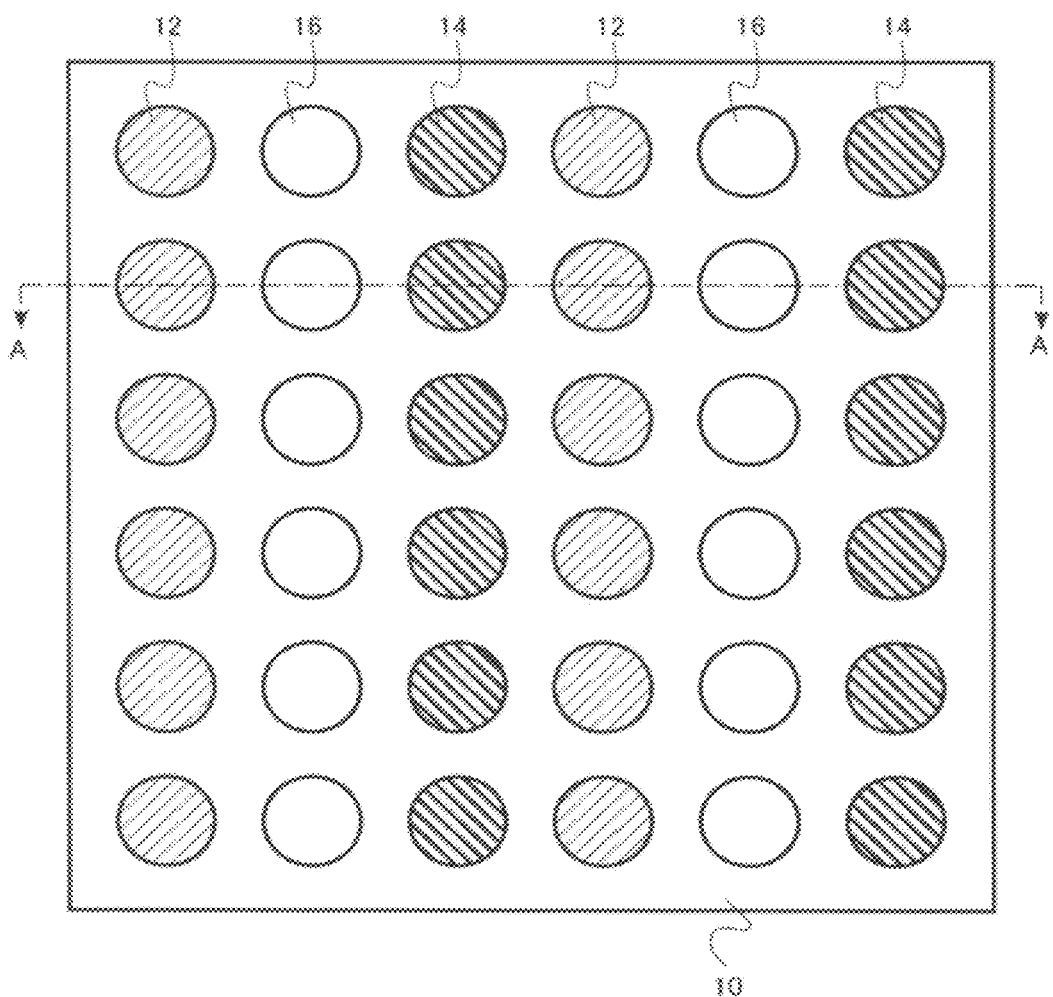
FIG. 1 is a schematic top view illustrating a light emitting device according to a first embodiment.
Figure 2:
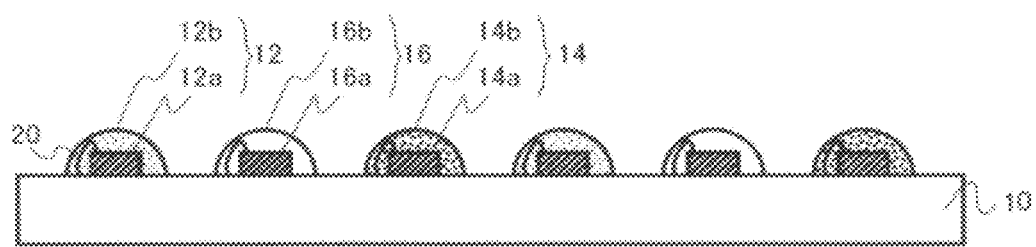
FIG. 2 is a sectional view taken on a line A-A of FIG. 1.

FIG. 1 is a schematic top view illustrating a light emitting device according to the first embodiment. FIG. 2 is a sectional view taken on a line A-A of FIG. 1.

The light emitting device of the first embodiment is a white-color light emitting device in which plural first light emitting units 12, plural second light emitting units 14, and plural third light emitting units 16 are disposed on a board 10.

The plural first light emitting units 12, the plural second light emitting units 14, and the plural third light emitting units 16 are arrayed in column, respectively. The column of the third light emitting units 16 is disposed between the column of the first light emitting unit 12 and the second light emitting units 14.

The first light emitting unit 12 includes a first light emitting element 12a that is mounted on the board and a first fluorescent layer 12b that is formed on the first light emitting element 12, and includes the green phosphor. The second light emitting unit 14 includes a second light emitting element 14a that is mounted on the board and a second fluorescent layer 14b that is formed on the second light emitting element 14b, and includes the red phosphor. The third light emitting unit 16 includes a third light emitting element 16a that is mounted between the first light emitting element 12a and the second light emitting element 14a and a transparent resin layer 16b, such as a silicone resin, which is formed on the third light emitting element 16a.

The first light emitting element 12a, the second light emitting element 14a, and the third light emitting element 16a emit the near-ultraviolet light to the blue light, that is, the light having the wavelength of 250 nm to 500 nm. In the first embodiment, the first light emitting element 12a, the second light emitting element 14a, and the third light emitting element 16a are described as the same kind of blue LED chip by way of example. Desirably all the first light emitting element 12a, the second light emitting element 14a, and the third light emitting element 16a are the same kind of light emitting element from the viewpoint of ease of design or production. However, the first light emitting element 12a, the second light emitting element 14a, and the third light emitting element 16a may be different kinds of light emitting elements.

For example, each of the light emitting elements 12a, 14a, and 16a is connected to wiring (not illustrated) through a gold wire 20. Driving currents are supplied to the light emitting elements 12a, 14a, and 16a from the outside through the wiring, whereby the light emitting elements 12a, 14a, and 16a emit the blue light for excitation.

The fluorescent layers are formed while the green phosphor and the red phosphor are dispersed in the transparent resin, for example, a silicone resin, respectively.

In the first embodiment, a so-called sialon phosphor is applied to the green phosphor and the red phosphor. Because the decrease in luminous efficiency at high temperature, that is, the thermal quenching is small in the sialon phosphor, the sialon phosphor is suitable to the high-density-packaging or high-power light emitting device.

The sialon green phosphor of the first embodiment has a composition expressed by the following equation (1), and the red phosphor has a composition expressed by the following equation (2).

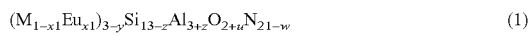
$$(M_{1-x1}Eu_{x1})_{3-y}Si_{13-z}Al_{3+z}O_{2+u}N_{21-w} \quad (1)$$

(In the equation (1), M is an element that is selected from IA group elements, IIA group elements, IIIA group elements, IIIB group elements except Al (Aluminum), rare-earth elements, and IVB group elements. And x1, y, z, u, and w satisfy the following relationship.

$$0 < x1 \leq 1,$$

$$-0.1 \leq y \leq 0.15,$$

$$-1 \leq z \leq 1,$$

$$-1 < u - w \leq 1.5)$$

The sialon phosphor having the composition expressed by the equation (1) is a green phosphor (G). The green phosphor (G) emits the light ranging from the blue-green color to the yellow-green color, that is, the light having the peak at the wavelength of 490 to 580 nm, which is longer than the excitation light, when the green phosphor (G) is excited by the light having the wavelength of 250 nm to 500 nm, that is, the near-ultraviolet light or the blue light.

$$(M'_{1-x2}Eu_{x2})_aSi_bAlO_cN_d \quad (2)$$

(In the equation (2), M' is an element that is selected from IA group elements, IIA group elements, IIIA group elements, IIIB group elements except Al (Aluminum), rare-earth elements, and IVB group elements. And x2, a, b, c, and d satisfy the following relationship.

$$0 < x2 \leq 1,$$

$$0.60 < a < 0.95,$$

$$2.0 < b < 3.9,$$

$$0.04 \leq c \leq 0.6,$$

$$4 < d < 5.7)$$

The sialon phosphor having the composition expressed by the equation (2) is a red phosphor (R). The green phosphor (R) emits the light ranging from the orange color to the red color, that is, the light having the peak at the wavelength of 580 to 700 nm, which is longer than the excitation light, when the red phosphor (R) is excited by the light having the wavelength of 250 nm to 500 nm, that is, the near-ultraviolet light or the blue light.

The first light emitting element 12a constitutes a light source that excites the green phosphor in the first fluorescent layer 12b, and the first light emitting unit 12 emits the green light. The second light emitting element 14a constitutes a light source that excites the red phosphor in the second fluorescent layer 14b, and the second light emitting unit 14 emits the red light. The third light emitting element 16a constitutes a light source of the blue light, and the third light emitting unit 16 emits the blue light.

The green light, the red light, and the blue light, emitted from the first light emitting unit 12, the second light emitting unit 14, and the third light emitting unit 16, are mixed to generate the white-color light.

For example, when the sialon red fluorescent layer and the sialon green fluorescent layer emit light while being stacked on one blue LED chip without separating the sialon red fluorescent layer and the sialon green fluorescent layer, in the order of several percent light emitted from the green fluorescent layer is absorbed by the red fluorescent layer, thereby degrading the luminous efficiency of the light emitting device.

In the first embodiment, the first fluorescent layer 12a and the second fluorescent layer 14a are separated in a non-contact manner with gas interposed therebetween. In the first embodiment, the gas is air. Accordingly, the first fluorescent layer 12a and the second fluorescent layer 14a are separated without interposing a solid-state layer, such as resin, which causes scattering and diffusion. Therefore, a ratio of the green light from the green fluorescent layer reaching the red fluorescent layer and a ratio of the red light from the red fluorescent layer reaching the green fluorescent layer are decreased to suppress the reabsorption. Particularly, the reabsorption of the green light by the red phosphor having the high absorption factor of the green emission region is effectively suppressed.

The third light emitting unit 16 is disposed between the first light emitting unit 12 and the second light emitting unit 14. Therefore, a distance between the first fluorescent layer 12a and the second fluorescent layer 14a is further increased. Accordingly, the reabsorption can further be suppressed. Because the third light emitting unit 16 is disposed in the gap between the first fluorescent layer 12a and the second fluorescent layer 14a, the packaging density of the white-color light emitting device is not decreased.

According to the first embodiment, the white-color light emitting device that suppresses the reabsorption between the phosphors with the high packaging density to realize the excellent luminous efficiency can be provided with simple configuration.

Second Embodiment

A second embodiment differs from the first embodiment in that the third light emitting elements are mounted between all the first light emitting elements and all the second light emitting elements, that is, the third light emitting units are disposed between all the first light emitting units and all the second light emitting units. Therefore, the descriptions of the contents overlapped with those of the first embodiment are omitted.

Figure 3:
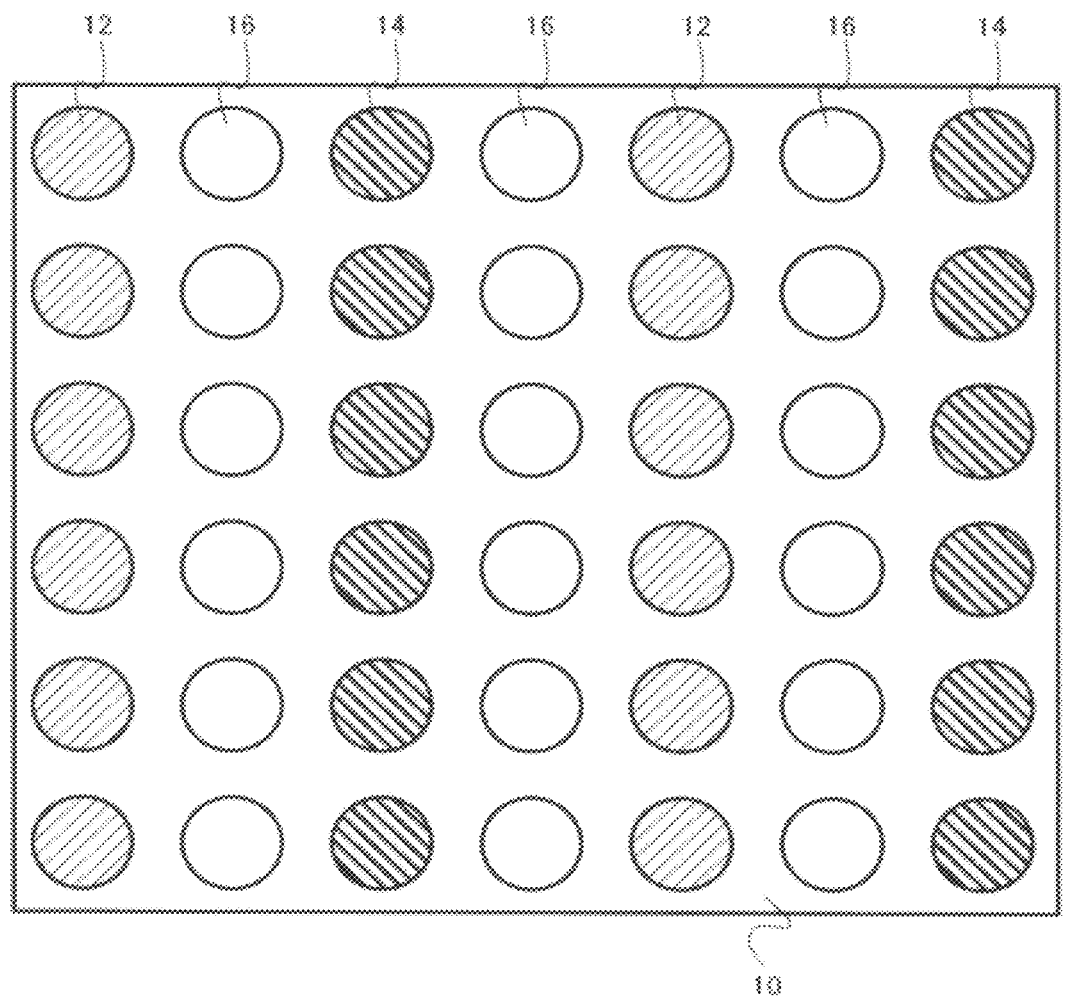
FIG. 3 is a schematic top view illustrating a light emitting device according to a second embodiment.

FIG. 3 is a schematic top view illustrating a light emitting device of the second embodiment. Because the third light emitting elements are mounted between all the first light emitting elements and all the second light emitting elements, the third light emitting units 16 are disposed between all the first light emitting units 12 and all the second light emitting units 14.

According to the second embodiment, all the distances between the first fluorescent layers 12a and the second fluorescent layers 14a are increased. Accordingly, the reabsorption can further be suppressed. Because the third light emitting units 16 that emit the blue light are disposed in the gaps between the first fluorescent layers 12a and the second fluorescent layers 14a, the packaging density of the white-color light emitting device is not decreased.

Third Embodiment

A third embodiment differs from the second embodiment in that the plural second light emitting units are surrounded by the plural third light emitting units, and the plural third light emitting units are surrounded by the first light emitting units. Therefore, the descriptions of the contents overlapped with those of the second embodiment are omitted.

Figure 4:
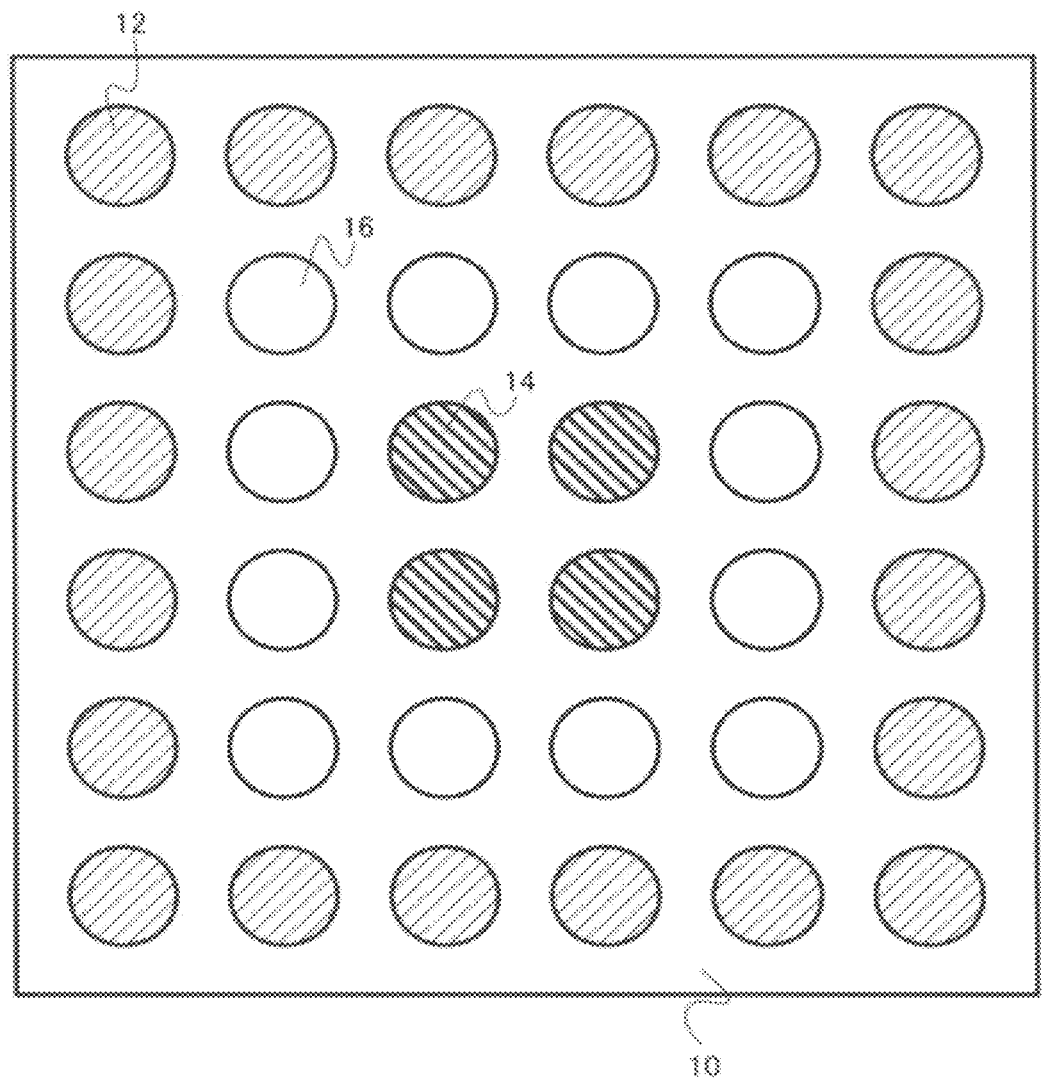
FIG. 4 is a schematic top view illustrating a light emitting device according to a third embodiment.

FIG. 4 is a schematic top view illustrating a light emitting device of the third embodiment. The second light emitting units 14 are disposed near the center of the board 10. A periphery of the second light emitting units 14 is surrounded by the third light emitting units 16. A periphery of the third light emitting units 16 is surrounded by the first light emitting units 12.

Therefore, the third light emitting units 16 are disposed between all the first light emitting units 12 and all the second light emitting unit 14.

According to the third embodiment, similarly to the second embodiment, all the distances between the first fluorescent layers 12a and the second fluorescent layers 14a are increased. Accordingly, the reabsorption can further be suppressed. Because the third light emitting units 16 that emit the blue light are disposed in the gap between the first fluorescent layers 12a and the second fluorescent layers 14a, the packaging density of the white-color light emitting device is not decreased. Advantageously the production is facilitated.

Alternatively, the plural first light emitting units may be surrounded by the plural third light emitting units, and the plural third light emitting units may be surrounded by the plural second light emitting units.

While certain embodiments have been described, these embodiments have been presented by way of example only, and are not intended to limit the scope of the inventions. Indeed, the light emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in addition to the blue LED chip, a semiconductor light emitting element that emits the light in the ultraviolet region or the blue light may be used as the light emitting element that emits the excitation light used in the light emitting device. For example, a gallium nitride compound semiconductor can be used as the LED. However, when the semiconductor light emitting element that emits the ultraviolet light is used as the excitation light source, it is necessary that a filter mechanism that blocks the ultraviolet light be provided in the light emitting device.

In the embodiments, the transparent resin layer is directly formed on the blue LED chip by way of example. Alternatively, for example, the transparent resin layer may be provided between the blue LED chip and the fluorescent layer or in an outer surface of the fluorescent layer.

In the embodiments, the sialon phosphor is applied to the green phosphor and the red phosphor by way of example. From the viewpoint of suppressing the thermal quenching, the sialon fluorescent, particularly the phosphors expressed by the equations (1) and (2) are desirably applied. Alternatively, another phosphor may be applied.

In the embodiments, for example, phosphors having plural compositions may be used as the first or second fluorescent layer in order to adjust color development of the light emitting device or white-color LED. The fluorescent layer may be formed by mixing the plural phosphors, or the fluorescent layer may be formed by stacking plural fluorescent layers including different phosphors.

The disposition patterns of the first to third light emitting element are not limited to the embodiments. However, any pattern can be adopted as long as the third light emitting element is mounted between the first and second light emitting elements.

In the embodiments, the silicone transparent resin is used as the resin layer formed on the third light emitting element by way of example. Alternatively, another transparent resin may be applied. The fluorescent layer including the yellow phosphor may be used as the resin layer in order to adjust the emission color of the light emitting device.

What is claimed is:

1. A light emitting device comprising:
   a board;
   a plurality of first light emitting units each of which includes a first light emitting element mounted on the board to emit light having a wavelength of 250 nm to 500 nm and a first fluorescent layer formed on the first light emitting element, the first fluorescent layer including a green phosphor;
   a plurality of second light emitting units each of which includes a second light emitting element mounted on the board to emit the light having the wavelength of 250 nm to 500 nm and a second fluorescent layer formed on the second light emitting element, the second fluorescent layer including a red phosphor, the second fluorescent layers and the first fluorescent layers being separated in a non-contact manner with air interposed therebetween; and
   a plurality of third light emitting units each of which includes a third light emitting element mounted on the board to emit the light having the wavelength of 250 nm to 500 nm and a resin layer formed on the third light emitting element, the resin layer including neither a green phosphor nor a red phosphor, the third light emitting units being disposed between the first light emitting units and the second light emitting units.

2. The device according to claim 1, wherein the third light emitting element is a blue LED.

3. The device according to claim 1, wherein the resin layer is made of a transparent resin.

4. The device according to claim 1, wherein the resin layer is made of a silicone resin.

5. The device according to claim 1, wherein the resin layer includes a yellow phosphor.

6. The device according to claim 1, wherein the first, second, and third light emitting elements are an identical kind of light emitting element.

7. The device according to claim 1, wherein the green phosphor has a composition expressed by equation (1):

$$(M_{1-x1}Eu_{x1})_{3-y}Si_{13-z}Al_{3+z}O_{2+u}N_{21-w} \quad (1)$$

(In the equation (1), M is an element selected from IA group elements, IIA group elements, IIIA group elements, IIIB group elements except Al (Aluminum), rare-earth elements, and IVB group elements, and x1, y, z, u, and w satisfy the following relationship:

$0<x1\leq 1$, $-0.1\leq y\leq 0.15$, $-1\leq z\leq 1$, $-1<u-w\leq 1.5$).

8. The device according to claim 1, wherein the red phosphor has a composition expressed by equation (2):

$$(M'_{1-x2}Eu_{x2})_a Si_b AlO_c N_d \quad (2)$$

(In the equation (2), M' is an element selected from IA group elements, IIA group elements, IIIA group elements, IIIB group elements except Al (Aluminum), rare-earth elements, and IVB group elements, and x2, a, b, c, and d satisfy the following relationship:

$0<x2\leq 1$, $0.60<a<0.95$, $2.0<b<3.9$, $0.04\leq c\leq 0.6$, $4<d<5.7$).

9. The device according to claim 7, wherein the red phosphor has a composition expressed by the equation (2):

$$(M'_{1-x2}Eu_{x2})_a Si_b AlO_c N_d \quad (2)$$

(In the equation (2), M' is an element selected from IA group elements, IIA group elements, IIIA group elements, IIIB group elements except Al (Aluminum), rare-earth elements, and IVB group elements, and x2, a, b, c, and d satisfy the following relationship:

$0<x2\leq 1$, $0.60<a<0.95$, $2.0<b<3.9$, $0.04\leq c\leq 0.6$, $4<d<5.7$).

10. The device according to claim 1, wherein the plurality of first light emitting units, the plurality of second light emitting units, and the plurality of third light emitting units are arrayed in column, respectively, and the column of the third light emitting units is disposed between the column of the first light emitting units and the column of the second light emitting units.

11. The device according to claim 1, wherein the plurality of second light emitting units are surrounded by the plurality of third light emitting units, and the plurality of third light emitting units are surrounded by the plurality of first light emitting units.

12. The device according to claim 1, wherein the plurality of first light emitting units are surrounded by the plurality of third light emitting units, and the plurality of third light emitting units are surrounded by the plurality of second light emitting units.

* * * * *